(12) United States Patent
Kori et al.

(10) Patent No.: US 6,551,929 B1
(45) Date of Patent: Apr. 22, 2003

(54) BIFURCATED DEPOSITION PROCESS FOR DEPOSITING REFRACTORY METAL LAYERS EMPLOYING ATOMIC LAYER DEPOSITION AND CHEMICAL VAPOR DEPOSITION TECHNIQUES

(75) Inventors: Moris Kori, Palo Alto, CA (US); Alfred W. Mak, Union City, CA (US); Jeong Soo Byun, Cupertino, CA (US); Lawrence Chung-Lai Lei, Milpitas, CA (US); Hua Chung, San Jose, CA (US); Ashok Sinha, Palo Alto, CA (US); Ming Xi, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/605,593

(22) Filed: Jun. 28, 2000

(51) Int. Cl.⁷ .............................................. H01L 21/44
(52) U.S. Cl. ................ 438/685; 438/652; 438/657; 438/654; 438/656; 438/680; 438/642; 438/643; 438/644; 438/648; 438/761; 438/763; 427/99; 427/124; 427/304; 427/255.28; 427/255.38; 427/255.391; 427/255.392; 427/255.7
(58) Field of Search .................... 438/654, 652, 438/656, 653, 680, 685, 642, 643, 644, 648, 761, 763; 427/99, 124, 304, 255.28, 255.38, 255.391, 255.392, 255.7

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,486,487 A | 12/1984 | Skarp | 428/216 |
| 4,767,494 A | 8/1988 | Kobayashi et al. | 156/606 |
| 4,806,321 A | 2/1989 | Nishizawa et al. | 422/245 |
| 4,813,846 A | 3/1989 | Helms | 414/744.1 |
| 4,829,022 A | 5/1989 | Kobayashi et al. | 437/107 |
| 4,834,831 A | 5/1989 | Nishizawa et al. | 156/611 |
| 4,838,983 A | 6/1989 | Schumaker et al. | 156/613 |
| 4,838,993 A | 6/1989 | Aoki et al. | 156/643 |

(List continued on next page.)

FOREIGN PATENT DOCUMENTS

| | | |
|---|---|---|
| DE | 196 27 017 | 1/1997 |
| DE | 198 20 147 | 7/1999 |
| EP | 0 344 352 A1 | 12/1989 |

(List continued on next page.)

OTHER PUBLICATIONS

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

Scheper, et al.,"Low–temperature deposition of titanium nitride films from dialkylhydrazine–based precursors", Materials Science in Semiconductor Processing 2 (1999), pp. 149–157.

Suzuki, et al., "A 0.2–$\mu$m contact filing by 450° C.–hydrazine–reduced TiN film with low resistivity", IEDM 92–979, pp. 11.8.1–11.8.3.

(List continued on next page.)

*Primary Examiner*—Kamand Cuneo
*Assistant Examiner*—David A. Zarneke
(74) *Attorney, Agent, or Firm*—Moser, Patterson & Sheridan, LLP.

(57) ABSTRACT

A method and system to form a refractory metal layer on a substrate features a bifurcated deposition process that includes nucleating a substrate using ALD techniques to serially expose the substrate to first and second reactive gases followed forming a bulk layer, adjacent to the nucleating layer, using CVD techniques to concurrently exposing the nucleation layer to the first and second gases.

60 Claims, 10 Drawing Sheets

U.S. PATENT DOCUMENTS

| | | | | |
|---|---|---|---|---|
| 4,840,921 A | 6/1989 | Matsumoto | ................ | 437/89 |
| 4,845,049 A | 7/1989 | Sunakawa | ................ | 437/81 |
| 4,859,625 A | 8/1989 | Nishizawa et al. | ........... | 437/81 |
| 4,859,627 A | 8/1989 | Sunakawa | ................ | 437/81 |
| 4,861,417 A | 8/1989 | Mochizuki et al. | ......... | 156/610 |
| 4,876,218 A | 10/1989 | Pessa et al. | ................ | 437/107 |
| 4,917,556 A | 4/1990 | Stark et al. | ................ | 414/217 |
| 4,927,670 A | 5/1990 | Erbil | ................ | 427/255.3 |
| 4,931,132 A | 6/1990 | Aspnes et al. | ............. | 156/601 |
| 4,951,601 A | 8/1990 | Maydan et al. | ............. | 118/719 |
| 4,960,720 A | 10/1990 | Shimbo | ................ | 437/105 |
| 4,975,252 A | 12/1990 | Nishizawa et al. | ......... | 422/245 |
| 4,993,357 A | 2/1991 | Scholz | ................ | 118/715 |
| 5,000,113 A | 3/1991 | Wang et al. | ................ | 118/723 |
| 5,013,683 A | 5/1991 | Petroff et al. | ............. | 437/110 |
| 5,028,565 A | 7/1991 | Chang et al. | ................ | 437/192 |
| 5,082,798 A | 1/1992 | Arimoto | ................ | 437/108 |
| 5,085,885 A | 2/1992 | Foley et al. | ................ | 477/38 |
| 5,091,320 A | 2/1992 | Aspnes et al. | ................ | 437/8 |
| 5,130,269 A | 7/1992 | Kitahara et al. | ............. | 437/111 |
| 5,166,092 A | 11/1992 | Mochizuki et al. | ......... | 437/105 |
| 5,173,474 A | 12/1992 | Connell et al. | ................ | 505/1 |
| 5,186,718 A | 2/1993 | Tepman et al. | ............. | 29/25.01 |
| 5,205,077 A | 4/1993 | Wittstock | ................ | 51/165 R |
| 5,225,366 A | 7/1993 | Yoder | ................ | 437/108 |
| 5,234,561 A | 8/1993 | Randhawa et al. | .... | 204/192.38 |
| 5,246,536 A | 9/1993 | Nishizawa et al. | ......... | 156/610 |
| 5,250,148 A | 10/1993 | Nishizawa et al. | ......... | 156/611 |
| 5,254,207 A | 10/1993 | Nishizawa et al. | ......... | 156/601 |
| 5,256,244 A | 10/1993 | Ackerman | ................ | 156/613 |
| 5,259,881 A | 11/1993 | Edwards et al. | ............ | 118/719 |
| 5,270,247 A | 12/1993 | Sakuma et al. | ............. | 437/133 |
| 5,278,435 A | 1/1994 | Van Hove et al. | ......... | 257/184 |
| 5,281,274 A | 1/1994 | Yoder | ................ | 118/697 |
| 5,286,296 A | 2/1994 | Sato et al. | ................ | 118/719 |
| 5,290,748 A | 3/1994 | Knuuttila et al. | ........... | 502/228 |
| 5,294,286 A | 3/1994 | Nishizawa et al. | ......... | 156/610 |
| 5,296,403 A | 3/1994 | Nishizawa et al. | ......... | 437/133 |
| 5,300,186 A | 4/1994 | Kitahara et al. | ............. | 156/613 |
| 5,311,055 A | 5/1994 | Goodman et al. | .......... | 257/593 |
| 5,316,615 A | 5/1994 | Copel | ................ | 117/95 |
| 5,316,793 A | 5/1994 | Wallace et al. | ............. | 427/248.1 |
| 5,330,610 A | 7/1994 | Eres et al. | ................ | 117/86 |
| 5,336,324 A | 8/1994 | Stall et al. | ................ | 118/719 |
| 5,338,389 A | 8/1994 | Nishizawa et al. | ............ | 117/89 |
| 5,348,911 A | 9/1994 | Jurgensen et al. | ............ | 117/91 |
| 5,374,570 A | 12/1994 | Nasu et al. | ................ | 437/40 |
| 5,395,791 A | 3/1995 | Cheng et al. | ................ | 437/105 |
| 5,438,952 A | 8/1995 | Otsuka | ................ | 117/84 |
| 5,439,876 A | 8/1995 | Graf et al. | ................ | 505/447 |
| 5,441,703 A | 8/1995 | Jurgensen | ................ | 422/129 |
| 5,443,033 A | 8/1995 | Nishizawa et al. | ............ | 117/86 |
| 5,443,647 A | 8/1995 | Aucoin et al. | ....... | 118/723 ME |
| 5,455,072 A | 10/1995 | Bension et al. | ........... | 427/255.7 |
| 5,458,084 A | 10/1995 | Thorne et al. | ................ | 117/89 |
| 5,469,806 A | 11/1995 | Mochizuki et al. | ........... | 117/97 |
| 5,480,818 A | 1/1996 | Matsumoto et al. | .......... | 437/40 |
| 5,483,919 A | 1/1996 | Yokoyama et al. | ........... | 117/89 |
| 5,484,664 A | 1/1996 | Kitahara et al. | ............. | 428/641 |
| 5,503,875 A | 4/1996 | Imai et al. | ................ | 427/255.3 |
| 5,521,126 A | 5/1996 | Okamura et al. | ........... | 437/235 |
| 5,527,733 A | 6/1996 | Nishizawa et al. | ......... | 437/160 |
| 5,532,511 A | 7/1996 | Nishizawa et al. | ................ | 257/627 |
| 5,540,783 A | 7/1996 | Eres et al. | ................ | 118/725 |
| 5,580,380 A | 12/1996 | Liu et al. | ................ | 117/86 |
| 5,601,651 A | 2/1997 | Watabe | ................ | 118/715 |
| 5,609,689 A | 3/1997 | Kato et al. | ................ | 118/719 |
| 5,616,181 A | 4/1997 | Yamamoto et al. | ... | 118/723 ER |
| 5,637,530 A | 6/1997 | Gaines et al. | ............. | 114/105 |
| 5,641,984 A | 6/1997 | Aftergut et al. | ............. | 257/433 |
| 5,644,128 A | 7/1997 | Wollnik et al. | ............. | 250/251 |
| 5,667,592 A | 9/1997 | Boitnott et al. | ............. | 118/719 |
| 5,674,786 A | 10/1997 | Turner et al. | ................ | 437/225 |
| 5,693,139 A | 12/1997 | Nishizawa et al. | ........... | 117/89 |
| 5,695,564 A | 12/1997 | Imahashi | ................ | 118/719 |
| 5,705,224 A | 1/1998 | Murota et al. | ............. | 427/248.1 |
| 5,707,880 A | 1/1998 | Aftergut et al. | ................ | 437/3 |
| 5,711,811 A | 1/1998 | Suntola et al. | ............. | 118/711 |
| 5,730,801 A | 3/1998 | Tepman et al. | ............. | 118/719 |
| 5,730,802 A | 3/1998 | Ishizumi et al. | ............. | 118/719 |
| 5,747,113 A | 5/1998 | Tsai | ................ | 427/255.5 |
| 5,749,974 A | 5/1998 | Habuka et al. | ............. | 118/725 |
| 5,788,447 A | 8/1998 | Yonemitsu et al. | ......... | 414/217 |
| 5,788,799 A | 8/1998 | Steger et al. | ................ | 156/345 |
| 5,796,116 A | 8/1998 | Nakata et al. | ................ | 257/66 |
| 5,801,634 A | 9/1998 | Young et al. | ................ | 340/635 |
| 5,807,792 A | 9/1998 | Ilg et al. | ................ | 438/758 |
| 5,830,270 A | 11/1998 | McKee et al. | ............. | 117/106 |
| 5,835,677 A | 11/1998 | Li et al. | ................ | 392/401 |
| 5,851,849 A | 12/1998 | Comizzoli et al. | ............. | 438/38 |
| 5,855,675 A | 1/1999 | Doering et al. | ............. | 118/719 |
| 5,855,680 A | 1/1999 | Soininen et al. | ............. | 118/719 |
| 5,856,219 A | 1/1999 | Naito et al. | ................ | 438/241 |
| 5,858,102 A | 1/1999 | Tsai | ................ | 118/719 |
| 5,866,213 A | 2/1999 | Foster et al. | ................ | 427/573 |
| 5,866,795 A | 2/1999 | Wang et al. | ................ | 73/1.36 |
| 5,879,459 A | 3/1999 | Gadgil et al. | ................ | 118/715 |
| 5,882,165 A | 3/1999 | Maydan et al. | ............. | 414/217 |
| 5,882,413 A | 3/1999 | Beaulieu et al. | ............. | 118/719 |
| 5,904,565 A | 5/1999 | Nguyen et al. | ............. | 438/687 |
| 5,916,365 A | 6/1999 | Sherman | ................ | 117/92 |
| 5,923,056 A | 7/1999 | Lee et al. | ................ | 257/192 |
| 5,923,985 A | 7/1999 | Aoki et al. | ................ | 438/301 |
| 5,925,574 A | 7/1999 | Aoki et al. | ................ | 437/31 |
| 5,928,389 A | 7/1999 | Jevtic | ................ | 29/25.01 |
| 5,942,040 A | 8/1999 | Kim et al. | ................ | 118/726 |
| 5,947,710 A | 9/1999 | Cooper et al. | ................ | 418/63 |
| 5,972,430 A | 10/1999 | DiMeo, Jr. et al. | ..... | 427/255.32 |
| 6,001,669 A | 12/1999 | Gaines et al. | ............. | 438/102 |
| 6,015,590 A | 1/2000 | Suntola et al. | ......... | 427/255.23 |
| 6,025,627 A | 2/2000 | Forbes et al. | ................ | 257/321 |
| 6,036,773 A | 3/2000 | Wang et al. | ................ | 117/97 |
| 6,042,652 A | 3/2000 | Hyun et al. | ................ | 118/719 |
| 6,043,177 A | 3/2000 | Falconer et al. | ................ | 502/4 |
| 6,051,286 A | 4/2000 | Zhao et al. | ................ | 427/576 |
| 6,062,798 A | 5/2000 | Muka | ................ | 414/416 |
| 6,071,808 A | 6/2000 | Merchant et al. | ........... | 438/633 |
| 6,084,302 A | 7/2000 | Sandhu | ................ | 257/751 |
| 6,086,677 A | 7/2000 | Umotoy et al. | ............. | 118/715 |
| 6,110,556 A | 8/2000 | Bang et al. | ............. | 428/64.1 |
| 6,113,977 A | 9/2000 | Soininen et al. | ............. | 427/64 |
| 6,117,244 A | 9/2000 | Bang et al. | ................ | 118/715 |
| 6,124,158 A | 9/2000 | Dautartas et al. | ............ | 438/216 |
| 6,130,147 A | 10/2000 | Major et al. | ................ | 438/604 |
| 6,139,700 A * | 10/2000 | Kang et al. | ............. | 204/192.17 |
| 6,140,237 A | 10/2000 | Chan et al. | ................ | 438/687 |
| 6,140,238 A | 10/2000 | Kitch | ................ | 438/687 |
| 6,143,659 A | 11/2000 | Leem | ................ | 438/688 |
| 6,144,060 A | 11/2000 | Park et al. | ................ | 257/310 |
| 6,158,446 A | 12/2000 | Mohindra et al. | ......... | 134/25.4 |
| 6,174,377 B1 | 1/2001 | Doering et al. | ............. | 118/729 |
| 6,174,809 B1 | 1/2001 | Kang et al. | ................ | 438/682 |
| 6,194,310 B1 * | 2/2001 | Hsu et al. | ................ | 438/643 |
| 6,026,967 A1 | 3/2001 | Mak et al. | ................ | 118/666 |
| 6,197,683 B1 * | 3/2001 | Kang et al. | ................ | 438/643 |
| 6,200,893 B1 * | 3/2001 | Sneh | ................ | 438/685 |
| 6,203,613 B1 | 3/2001 | Gates et al. | ................ | 117/104 |
| 6,207,302 B1 | 3/2001 | Sugiura et al. | ............. | 428/690 |
| 6,248,605 B1 | 6/2001 | Harkonen et al. | ............. | 438/29 |
| 6,270,572 B1 | 8/2001 | Kim et al. | ................ | 117/93 |
| 6,271,148 B1 | 8/2001 | Kao et al. | ................ | 438/727 |

| | | | | | | |
|---|---|---|---|---|---|---|
| | 6,287,965 B1 * | 9/2001 | Kang et al. .......... 438/648 | JP | 02-074587 | 3/1990 |
| | 6,291,876 B1 | 9/2001 | Stumborg et al. ......... 257/632 | JP | 02-106822 | 4/1990 |
| | 6,305,314 B1 | 10/2001 | Sneh et al. ........... 118/723 R | JP | 02-129913 | 5/1990 |
| | 6,306,216 B1 | 10/2001 | Kim et al. ............. 118/725 | JP | 02-162717 | 6/1990 |
| | 6,316,098 B1 | 11/2001 | Yitzchaik et al. ........... 428/339 | JP | 02-172895 | 7/1990 |
| | 2001/0000866 A1 | 5/2001 | Sneh et al. ........... 118/723 R | JP | 02-196092 | 8/1990 |
| | 2001/0009140 A1 | 7/2001 | Bondestam et al. ....... 118/725 | JP | 02-203517 | 8/1990 |
| | 2001/0011526 A1 | 8/2001 | Doering et al. ......... 118/729 | JP | 02-230690 | 9/1990 |
| | 2001/0031562 A1 | 10/2001 | Raaijmakers et al. ...... 438/770 | JP | 02-230722 | 9/1990 |
| | 2001/0034123 A1 | 10/2001 | Jeon et al. .......... 438/643 | JP | 02-246161 | 10/1990 |
| | 2001/0041250 A1 | 11/2001 | Werkhoven et al. ....... 428/212 | JP | 02-264491 | 10/1990 |
| | 2001/0042799 A1 | 11/2001 | Kim et al. ............ 239/553 | JP | 02-283084 | 11/1990 |
| | | | | JP | 02-304916 | 12/1990 |
| | FOREIGN PATENT DOCUMENTS | | | JP | 03-019211 | 1/1991 |
| EP | 0 429 270 A2 | | 5/1991 | JP | 03-022569 | 1/1991 |
| EP | 0 442 490 A1 | | 8/1991 | JP | 03-023294 | 1/1991 |
| EP | 0799641 | | 10/1997 | JP | 03-023299 | 1/1991 |
| EP | 0 799 641 A2 | | 10/1997 | JP | 03-044967 | 2/1991 |
| FR | 2 626 110 | | 7/1989 | JP | 03-048421 | 3/1991 |
| FR | 2 692 597 | | 12/1993 | JP | 03-070124 | 3/1991 |
| GB | 2 355 727 A | | 5/2001 | JP | 03-185716 | 8/1991 |
| JP | 58-098917 | | 6/1983 | JP | 03-208885 | 9/1991 |
| JP | 58-100419 | | 6/1983 | JP | 03-234025 | 10/1991 |
| JP | 60-065712 A | | 4/1985 | JP | 03-286522 | 12/1991 |
| JP | 61-035847 | | 2/1986 | JP | 03-286531 | 12/1991 |
| JP | 61-210623 | | 9/1986 | JP | 04-031391 | 2/1992 |
| JP | 62-069508 | | 3/1987 | JP | 04-031396 | 2/1992 |
| JP | 62-091495 A | | 4/1987 | JP | 04-031396 A | 2/1992 |
| JP | 62-141717 | | 6/1987 | JP | 04-100292 | 4/1992 |
| JP | 62-167297 | | 7/1987 | JP | 04-111418 | 4/1992 |
| JP | 62-171999 | | 7/1987 | JP | 04-132214 | 5/1992 |
| JP | 62-232919 | | 10/1987 | JP | 04-132681 | 5/1992 |
| JP | 63-062313 | | 3/1988 | JP | 04/151822 | 5/1992 |
| JP | 63-085098 | | 4/1988 | JP | 04-162418 | 6/1992 |
| JP | 63-090833 | | 4/1988 | JP | 04-175299 | 6/1992 |
| JP | 63-222420 | | 9/1988 | JP | 04-186824 | 7/1992 |
| JP | 63-222421 | | 9/1988 | JP | 04-212411 | 8/1992 |
| JP | 63-227007 | | 9/1988 | JP | 04-260696 | 9/1992 |
| JP | 63-252420 | | 10/1988 | JP | 04-273120 | 9/1992 |
| JP | 63-266814 | | 11/1988 | JP | 04-285167 | 10/1992 |
| JP | 64-009895 | | 1/1989 | JP | 04-291916 | 10/1992 |
| JP | 64-009896 | | 1/1989 | JP | 04-325500 | 11/1992 |
| JP | 64-009897 | | 1/1989 | JP | 04-328874 | 11/1992 |
| JP | 64-037832 | | 2/1989 | JP | 05-029228 | 2/1993 |
| JP | 64-082615 | | 3/1989 | JP | 05-047665 | 2/1993 |
| JP | 64-082617 | | 3/1989 | JP | 05-047666 | 2/1993 |
| JP | 64-082671 | | 3/1989 | JP | 05-047668 | 2/1993 |
| JP | 64-082676 | | 3/1989 | JP | 05-074717 | 3/1993 |
| JP | 01-103982 | | 4/1989 | JP | 05-074724 | 3/1993 |
| JP | 01-103996 | | 4/1989 | JP | 05-102189 | 4/1993 |
| JP | 64-090524 | | 4/1989 | JP | 05-160152 | 6/1993 |
| JP | 01-117017 | | 5/1989 | JP | 05-175143 | 7/1993 |
| JP | 01-143221 | | 6/1989 | JP | 05-175145 | 7/1993 |
| JP | 01-143233 | | 6/1989 | JP | 05-182906 | 7/1993 |
| JP | 01-154511 | | 6/1989 | JP | 05-186295 | 7/1993 |
| JP | 01-236657 | | 9/1989 | JP | 05-206036 | 8/1993 |
| JP | 01-245512 | | 9/1989 | JP | 05-234899 | 9/1993 |
| JP | 01-264218 | | 10/1989 | JP | 05-235047 | 9/1993 |
| JP | 01-270593 | | 10/1989 | JP | 05-251339 | 9/1993 |
| JP | 01-272108 | | 10/1989 | JP | 05-270997 | 10/1993 |
| JP | 01-290221 | | 11/1989 | JP | 05-283336 | 10/1993 |
| JP | 01-290222 | | 11/1989 | JP | 05-291152 | 11/1993 |
| JP | 01-296673 | | 11/1989 | JP | 05-304334 | 11/1993 |
| JP | 01-303770 | | 12/1989 | JP | 05-343327 | 12/1993 |
| JP | 01-305894 | | 12/1989 | JP | 05-343685 | 12/1993 |
| JP | 01-313927 | | 12/1989 | JP | 06-045606 | 2/1994 |
| JP | 02-012814 | | 1/1990 | JP | 06-132236 | 5/1994 |
| JP | 02-014513 | | 1/1990 | JP | 06-177381 | 6/1994 |
| JP | 02-017634 | | 1/1990 | JP | 06-196809 | 7/1994 |
| JP | 02-063115 | | 3/1990 | JP | 06-222388 | 8/1994 |
| JP | 02-074029 | | 3/1990 | JP | 06-224138 | 8/1994 |

| | | |
|---|---|---|
| JP | 06-230421 | 8/1994 |
| JP | 06-252057 | 9/1994 |
| JP | 06-291048 | 10/1994 |
| JP | 07-070752 | 3/1995 |
| JP | 07-086269 | 3/1995 |
| JP | 08-181076 | 7/1996 |
| JP | 08-245291 | 9/1996 |
| JP | 08-264530 | 10/1996 |
| JP | 09-260786 | 10/1997 |
| JP | 09-293681 | 11/1997 |
| JP | 10-188840 | 7/1998 |
| JP | 10-190128 | 7/1998 |
| JP | 10-308283 | 11/1998 |
| JP | 11-269652 | 10/1999 |
| JP | 2000-031387 | 1/2000 |
| JP | 2000-058777 | 2/2000 |
| JP | 2000-068072 | 3/2000 |
| JP | 2000-087029 | 3/2000 |
| JP | 2000-138094 | 5/2000 |
| JP | 2000-218445 | 8/2000 |
| JP | 2000-319772 | 11/2000 |
| JP | 2000-340883 | 12/2000 |
| JP | 2000-353666 | 12/2000 |
| JP | 2001-020075 | 1/2001 |
| JP | 2001-62244 | 3/2001 |
| JP | 2001-152339 | 6/2001 |
| JP | 2001-172767 | 6/2001 |
| JP | 2001-189312 | 7/2001 |
| JP | 2001-217206 | 8/2001 |
| JP | 2001-220287 | 8/2001 |
| JP | 2001-220294 | 8/2001 |
| JP | 2001-240972 | 9/2001 |
| JP | 2001-254181 | 9/2001 |
| JP | 2001-284042 | 10/2001 |
| JP | 2001-303251 | 10/2001 |
| JP | 2001-328900 | 11/2001 |
| WO | 90/02216 | 3/1990 |
| WO | WO/91/0510 | 7/1991 |
| WO | 91/10510 A1 | 7/1991 |
| WO | 93/02111 A1 | 2/1993 |
| WO | 96/17107 A1 | 6/1996 |
| WO | 96/18756 A1 | 6/1996 |
| WO | 98/06889 | 2/1998 |
| WO | WO98/51838 | 11/1998 |
| WO | 98/51838 | 11/1998 |
| WO | 99/01595 | 1/1999 |
| WO | WO/99/01595 | 1/1999 |
| WO | 99/13504 | 3/1999 |
| WO | 99/29924 A1 | 6/1999 |
| WO | WO/99/29924 | 6/1999 |
| WO | 99/41423 A2 | 8/1999 |
| WO | 00/11721 | 3/2000 |
| WO | WO/00/15865 | 3/2000 |
| WO | 00/15865 A1 | 3/2000 |
| WO | 00/15881 A2 | 3/2000 |
| WO | 00/16377 A2 | 3/2000 |
| WO | 00/54320 A1 | 9/2000 |
| WO | 00/63957 A1 | 10/2000 |
| WO | 00/79019 A1 | 12/2000 |
| WO | 00/79576 A1 | 12/2000 |
| WO | 01/15220 A1 | 3/2001 |
| WO | 01/15220 | 3/2001 |
| WO | 01/27346 A1 | 4/2001 |
| WO | 01/27347 A1 | 4/2001 |
| WO | 01/29280 A1 | 4/2001 |
| WO | 01/29891 A1 | 4/2001 |
| WO | 01/29893 A1 | 4/2001 |
| WO | 01/36702 A1 | 5/2001 |
| WO | 01/40541 A1 | 6/2001 |
| WO | 01/66832 A2 | 9/2001 |

OTHER PUBLICATIONS

Suzuki, et al., "LPCVD–TiN Using Hydrazine and $TiCl_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some β–diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Deposition / Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

Abstracts of articles—atomic layer deposition.

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149–154.

Choi, et al., "The effect of annealing on resistivity of low pressure chemical vapor depositied titanium diboride", J. Appl. Phys. 69(11) (Jun. 1, 1991), pp. 7853–7861.

Choi, et al., "Stability of $TiB_2$ as a Diffusion Barrier on Silicon", J. Electrochem. Soc. 138(10) (Oct. 1991), pp. 3062–3067.

"Cluster Tools for Fabrication of Advanced devices" Jap. J. of Applied Physics, Extended Abstracts, $22^{nd}$ Conference Solid State Devices and Materials (1990), pp. 849–852 XP000178141 (Article on Order—to be Provided).

"Applications of Integrated processing", Solid State Technology, US, Cowan Pub., vol. 37, No. 12 (Dec. 1, 1994), pp. 45–47 (Article on Order—to be Provided).

Kitigawa, et al., "Hydrogen–mediated low temperature epitaxy of Si in plasma–enhanced chemical vapor deposition", Applied Surface Science (2000), pp. 30–34 (Article on Order—to be Proviede).

Lee, et al., "Pulsed nucleation for ultra–high aspect ratio tungsten plugfill", Novellus Systems, Inc. (2001), pp. 1–2 (Article on Order—to be Provided).

Hultman, et al., "Review of the thermal and mechanical stability of TiN–based thin films", Zeitschrift Fur Metallkunde, 90(10) (Oct. 1999), pp. 803–813.

Klaus, et al., "Atomic Layer Deposition of $SiO_2$ Using Catalyzed and Uncatalyzed Self–Limiting Surface Reactions", Surface Review & Letters, 6(3&4) (1999), pp. 435–448.

Yamaguchi, et al., "Atomic–layer chemical–vapor–deposition of silicon dioxide films with extremely low hydrogen content", *Appl. Surf. Sci.*, vol. 130–132 (1998), pp. 202–207.

George, et al., "Surface Chemistry for Atomic Layer Growth", *J. Phys. Chem.*, vol. 100 (1996), pp. 13121–13131.

George, et al., "Atomic layer controlled deposition of $SiO_2$ and $Al_2O_3$ using ABAB . . . binary reaction sequence chemistry", *Appl. Surf. Sci.*, vol. 82/83 (1994), pp. 460–467.

Wise, et al., "Diethyldiethoxysilane as a new precursor for $SiO_2$ growth on silicon", *Mat. Res. Soc. Symp. Proc.*, vol. 334 (1994), pp. 37–43.

Niinistb, et al., "Synthesis of oxide thin films and overlayers by atomic layer epitaxy for advanced applications", *Mat. Sci. & Eng.*, vol. B41 (1996), pp. 23–29.

Ritala, et al.,"Perfectly conformal TiN and $Al_2O_3$ films deposited by atomic layer deposition", *Chemical Vapor Deposition*, vol. 5(1) (Jan. 1999), pp. 7–9.

Klaus, et al., "Atomically controlled growth of tungsten and tungsten nitride using sequential surface reactions". *Appl. Surf. Sci.*, vol. 162–163 (2000), pp. 479–491.

Min, et al., "Atomic layer deposition of TiN thin films by sequential introduction of Ti precursor and NH/sub3/", *Symp.: Advanced Interconnects and Contact Materials and Processes for Future Integrated Circuits* (Apr. 13–16, 1998), pp. 337–342.

Klaus, et al., "Atomic Layer Deposition of Tungsten using Sequential Surface Chemistry with a Sacrificial Stripping Reaction, " Thin Solid Films 360 (2000), pp. 145–153, (Accepted Nov. 16, 1999).

Min, et al., "Metal–Organic Atomic–Layer Deposition of Titanium–Silicon–Nitride Films", *Applied Physics Letters*, American Inst. Of Physics, vol. 75(11) (Sep. 13, 1999).

Martensson, et al., "Atomic Layer Epitaxy of Copper on Tantalum", *Chemical Vapor Deposition*, 3(1) (Feb. 1, 1997), pp. 45–50.

Ritala, et al. "Atomic Layer Epitaxy Growth of TiN Thin Films", *J. Electrochem. Soc.*, 142(8) (Aug. 1995), pp. 2731–2737.

Elers, et al., "NbC15 as a precursor in atomic layer epitaxy", *Appl. Surf. Sci.*, vol. 82/83 (1994), pp. 468–474.

Lee, "The Preparation of Titanium–Based Thin Film by CVD Using Titanium Chlorides as Precursors", *Chemical Vapor Deposition*, 5(2) (Mar. 1999), pp. 69–73.

Martensson, et al., "Atomic Layer Epitaxy of Copper, Growth & Selectivity in the Cu (II)–2,2.6,6–Tetramethyl–3, 5–Heptanedion ATE/H2 Process", *J. Electrochem. Soc.*, 145(8) (Aug. 1998), pp. 2926–2931.

Min, et al.,"Chemical Vapor Deposition of Ti–Si–N Films with Alternating Source Supply", *Mat., Res. Soc. Symp. Proc.*, vol. 564 (Apr. 5, 1999), pp. 207–210.

Bedair, "Atomic layer epitaxy deposition processes", *J. Vac. Sci. Techol.* 12(1) (Jan./Feb. 1994).

Yamaga, et al., "Atomic layer epitaxy of ZnS by a new gas supplying system in a low–pressure metalorganic vapor phase epitaxy", *J. of Crystal Growth* 117 (1992), pp. 152–155.

Elam, et al., "Nucleation and growth during tungsten atomic layer deposition on SiO2 surfaces," Thin Solid Films 386 (2001) pp. 41–52, (Accepted Dec. 14, 2000).

Kitagawa et al. *Hydrogen–mediated low–temperature epitaxy of Si in plasma–enhanced chemical vapor* deposition, Applied Surface Science, pp. 30–4 (2000).

Klaus et al. *Atomically controlled growth of tungsten and tungsten nitride using sequential surface reacions*, Applied Surface Science, pp. 479–481(2000).

U.S. patent application Ser. No. 09/678,266, Xi et al., filed Oct. 3, 2000.

Choi, et al., The Effect of Annealing on Reisitivity of Low Pressure Chemical Vapor Deposited Titanium Diboride. J. Appl. Phys. 69 (11). Jun. 1, 1991. pp. 7853–7861.

Choi, et al., Stability of TiB2 as a Diffusion Barrier on Silicon. J. Electrochem. Soc. vol. 138, No. 10, Oct. 1991. pp. 3062–3067.

* cited by examiner

BIFURCATED DEPOSITION PROCESS FOR DEPOSITING REFRACTORY METAL LAYERS EMPLOYING ATOMIC LAYER DEPOSITION AND CHEMICAL VAPOR DEPOSITION TECHNIQUES

BACKGROUND OF THE DISCLOSURE

1. Field of the Invention

This invention relates to the processing of semiconductor substrates. More particularly, this invention relates to improvements in the process of depositing refractory metal layers on semiconductor substrates.

2. Description of the Related Art

The semiconductor processing industry continues to strive for larger production yields while increasing the uniformity of layers deposited on substrates having increasing larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer. Chemical Vapor Deposition (CVD) is one of the most common deposition processes employed for depositing layers on a substrate. CVD is a flux-dependent deposition technique that requires precise control of the substrate temperature and precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates superior step coverage, compared to CVD, and is Atomic Layer Deposition (ALD). ALD is based upon Atomic Layer Epitaxy (ALE) that was originally employed to fabricate electroluminescent displays. ALD employs chemisorption to deposit a saturated monolayer of reactive precursor molecules on a substrate surface. This is achieved by alternatingly pulsing an appropriate reactive precursor into a deposition chamber. Each injection of a reactive precursor is separated by an inert gas purge to provide a new atomic layer additive to previous deposited layers to form a uniform layer on the substrate. The cycle is repeated to form the layer to a desired thickness. A drawback with ALD techniques is that the deposition rate is much lower than typical CVD techniques by at least on order of magnitude.

Employing the aforementioned deposition techniques it is seen that formation of a layer at a high deposition rate while providing adequate step coverage are conflicting characteristics often necessitating sacrificing one to obtain the other. This has been prevalent when depositing refractory metal layers cover gaps or vias during formation of contacts that interconnect adjacent metallic layers separated by a dielectric layer has proved problematic. Historically, CVD techniques have been employed to deposit conductive material in order to inexpensively and quickly form contacts. Due to the increasing integration of semiconductor circuitry, tungsten has been used based upon the superior step coverage of tungsten. As a result, deposition of tungsten employing CVD techniques enjoys wide application in semiconductor processing due to the high throughput of the process.

Depositing tungsten in this manner, however, is attendant with several disadvantages. For example, blanket deposition of a tungsten layer on a semiconductor wafer is time-consuming at temperatures below 400° C. The deposition rate of tungsten may be improved by increasing the deposition temperature to, e.g., about 500° C. to about 550° C. Temperatures in this range may compromise the structural and operational integrity of the underlying portions of the integrated circuit being formed. Tungsten has also frustrated photolithography steps during the manufacturing process by providing a relatively rough surface having a reflectivity of 20% or less than that of a silicon substrate. Finally, tungsten has proven difficult to deposit uniformly. This has been shown by variance in tungsten layers' thickness of greater than 1%, which frustrates control of the resistivity of the layer. Several prior attempts to overcome the aforementioned drawbacks have been attempted.

For example, in U.S. Pat. No. 5,028,565 to Chang et al., which is assigned to the assignee of the present invention, a method is disclosed to improve, inter alia, uniformity of tungsten layers by varying the deposition chemistry. The method includes, in pertinent part, formation of a nucleation layer over an intermediate, barrier, layer before depositing the tungsten layer via bulk deposition. The nucleation layer is formed from a gaseous mixture of tungsten hexafluoride, hydrogen, silane and argon. The nucleation layer is described as providing a layer of growth sites to promote uniform deposition of a tungsten layer thereon. The benefits provided by the nucleation layer are described as being dependent upon the barrier layer present. For example, were the barrier layer formed from titanium nitride the tungsten layer's thickness uniformity is improved as much as 15%. Were the barrier layer formed from sputtered tungsten or sputtered titanium tungsten the benefits provided by the nucleation layer are not substantial.

U.S. Pat. No. 5,879,459 to Gadgil et al. discloses an apparatus that takes advantage of ALD. To that end, the apparatus, a low profile, compact atomic layer deposition reactor (LP-CAR) has a body with a substrate processing region adapted to serve a single substrate or a planar array of substrates, as well as a valve, and a port for substrate loading and unloading. In some embodiments multiple reactors are stacked vertically and share a common robotic handler interface with a CVD system. In this manner, the robotic handler may manipulate substrates associated with both the CVD system and the LP-CAR The compact reactor is distinguished by having individual injectors, each of which comprises a charge tube formed between a charge valve and an injection valve. The charge valve connects the charge tube to a pressure regulated supply, and the injection valve opens the charge tube into the compact reactor. Rapidly cycling the valves injects fixed mass-charges of gas or vapor into the compact reactor.

What is needed, however, is a technique to deposit conductive layers having a deposition rate comparable to CVD techniques while providing the step coverage associated with ALD techniques.

SUMMARY OF THE INVENTION

A method and system to form a refractory metal layer on a substrate features a bifurcated deposition process that includes nucleating a substrate, when disposed in a first processing chamber, using ALD techniques to serially expose the substrate to first and second reactive gases followed by forming a layer, employing chemical vapor deposition to subject the nucleation layer, when disposed in a second processing chamber, to a bulk deposition of a compound contained in one of the first and second reactive gases. To that end, the system includes first and second processing chambers, each of which includes a holder, disposed therein to support the substrate. A gas delivery system and a pressure control system is in fluid communication with the processing chamber. A temperature control system is in thermal communication therewith. A robotic handler is disposed between the first and second processing chambers. A controller is in electrical communication with gas delivery systems, temperature control systems, pressure control systems, and the robotic handler. A memory is in data communication with the controller. The memory comprises a computer-readable medium having a computer-readable program embodied therein. The computer-readable program includes instructions for controlling the operation of the two processing chambers.

DETAILED DESCRIPTION OF THE INVENTION

Figure 1:
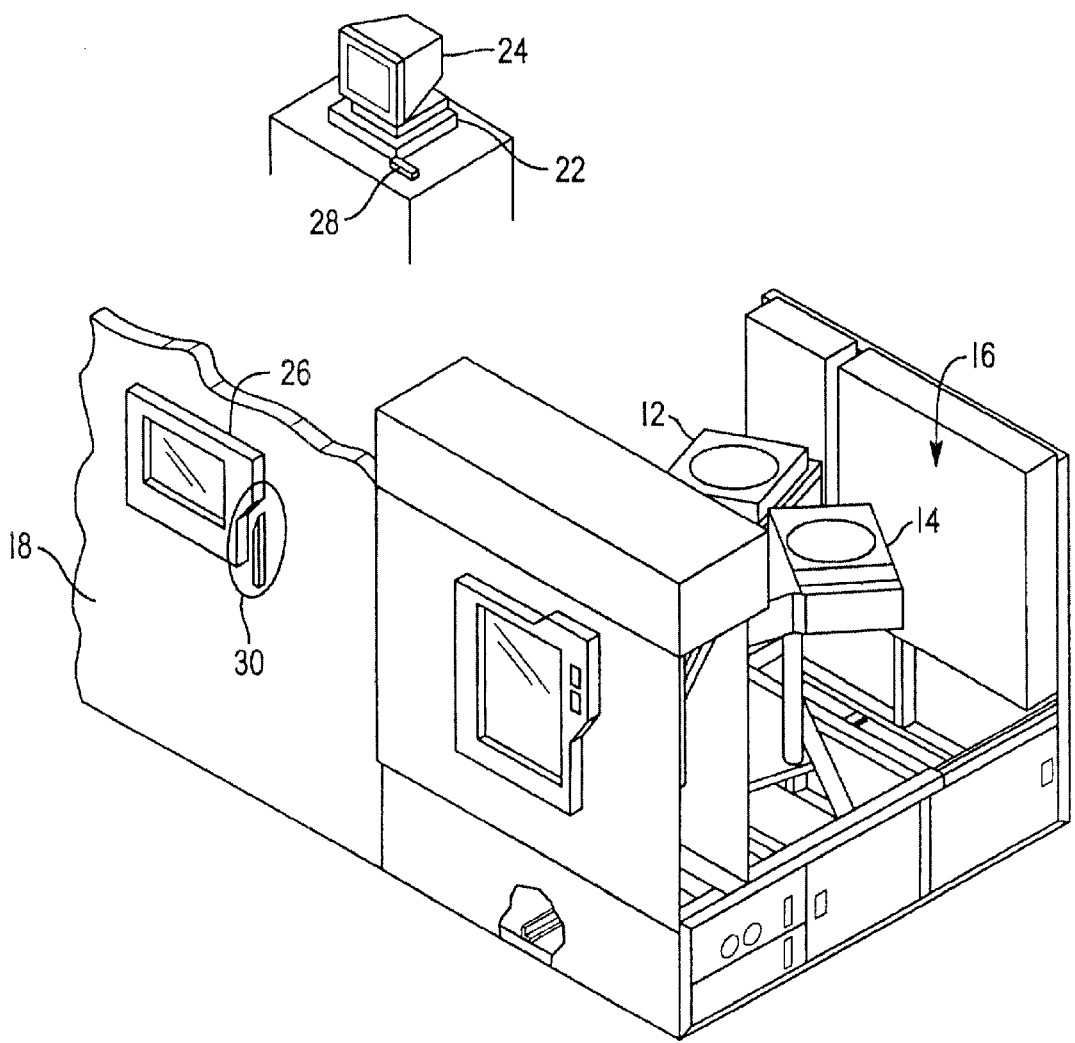
FIG. 1 is a perspective view of a semiconductor processing system in accordance with the present invention.

Referring to FIG. 1, an exemplary wafer processing system includes two or more processing chambers 12 and 14 disposed in a common work area 16 surrounded by a wall 18. The processing chambers 12 and 14 are in data communication with a controller 22 that is connected to one or more monitors, shown as 24 and 26. The monitors typically display common information concerning the process associated with the processing chamber 12 and 14. One of the monitors 26 is mounted to the wall 18, with the remaining monitor 24 being disposed in the work area 16. Operational control of the processing chambers 12 and 14 may be achieved use of a light pen, associated with one of the monitors 24 and 26, to communicate with the controller 22. For example, light pen 28 is associated with monitor 24 and facilitates communication with the controller 22 through monitor 24. Light pen 30 facilitates communication with the controller 22 through monitor 26.

Figure 2:
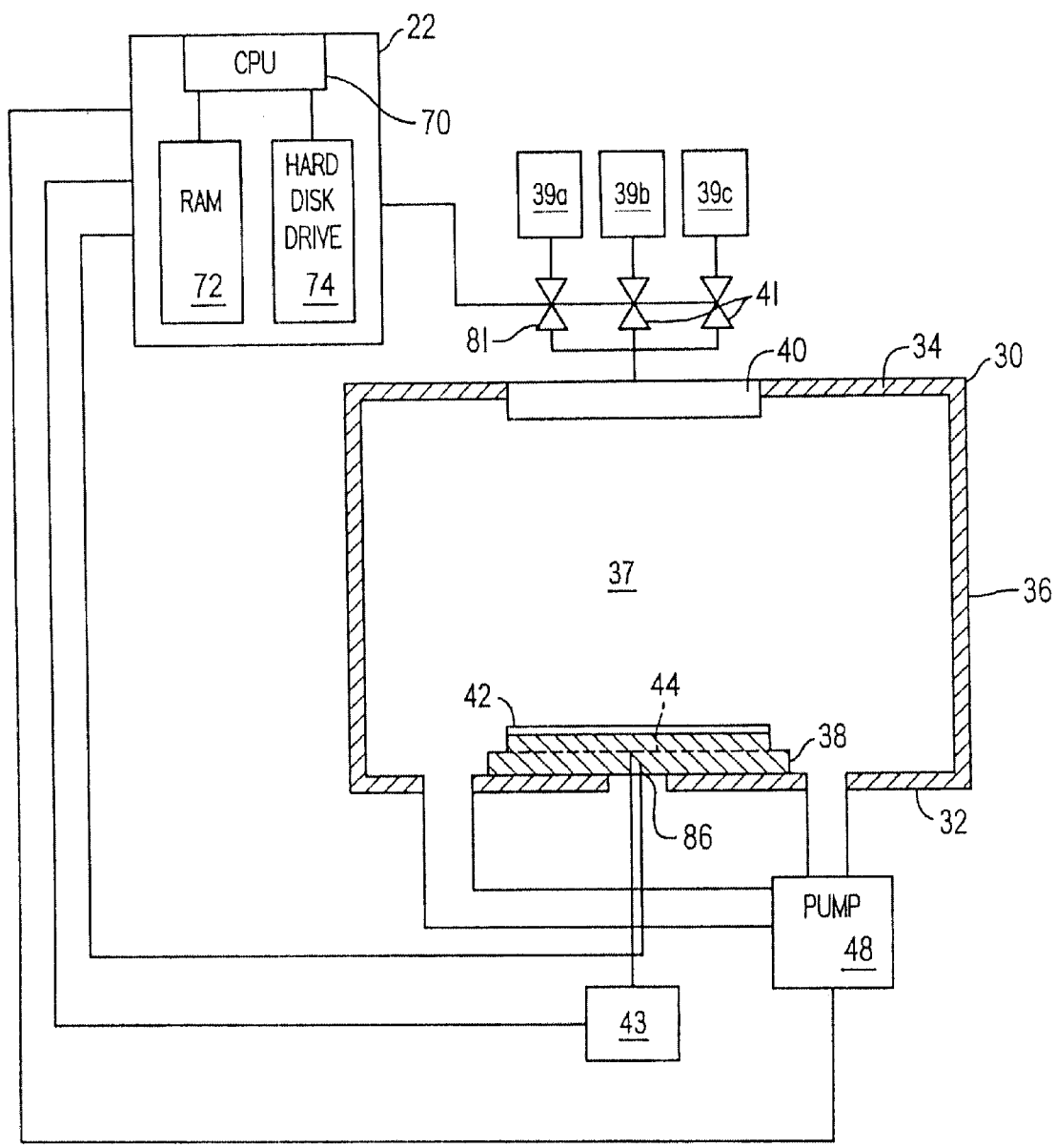
FIG. 2 is a detailed view of the processing chambers shown above in FIG. 1.

Referring both the to FIGS. 1 and 2, each of the processing chambers 12 and 14 includes a housing 30 having a base wall 32, a cover 34, disposed opposite to the base wall 32, and a sidewall 36, extending therebetween. The housing 30 defines a chamber 37, and a pedestal 38 is disposed within the processing chamber 37 to support a substrate 42, such as a semiconductor wafer. The pedestal 38 is mounted to move between the cover 34 and the base wall 32, using a displacement mechanism (not shown). Supplies of processing gases 39a, 39b, 39c and 39d are in fluid communication with the processing chamber 37 via a showerhead 40. Regulation of the flow of gases from the supplies 39a, 39b, 39c and 39d is effectuated via flow valves 41.

Depending on the specific process, the substrate 42 may be heated to a desired temperature prior to layer deposition via a heater embedded within the pedestal 38. For example, the pedestal 38 may be resistively heated by applying an electric current from an AC. power supply 43 to the heater element 44. The wafer 40 is, in turn, heated by the pedestal 38, and can be maintained within a desired process temperature range of, for example, about 20° C. to about 750° C. A temperature sensor 46, such as a thermocouple, is also embedded in the wafer support pedestal 38 to monitor the temperature of the pedestal 38 in a conventional manner. For example, the measured temperature may used in a feedback loop to control the electrical current applied to the heater element 44 by the power supply 43, such that the wafer temperature can be maintained or controlled at a desired temperature which is suitable for the particular process application. The pedestal 38 is optionally heated using radiant heat (not shown). A vacuum pump 48 is used to evacuate the processing chamber 37 and to help maintain the proper gas flows and pressure inside the processing chamber 37.

Figure 3:
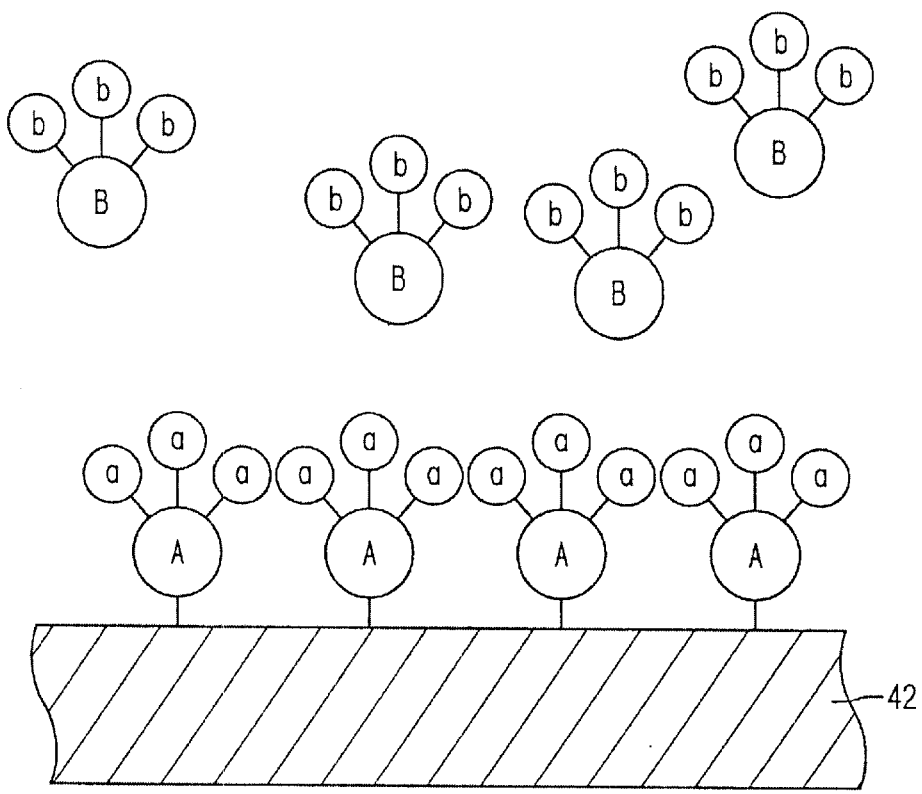
FIG. 3 is a schematic view showing deposition of a first molecule onto a substrate during ALD.

Referring to FIGS. 1 and 3, one or both of the processing chambers 12 and 14, discussed above may operate to deposit refractory metal layers, such as titanium (Ti) and tungsten (W) layers, on the substrate employing ALD techniques. Depending on the specific stage of processing, the refractory metal layer may be deposited on the material from which the substrate 42 is fabricated, e.g., $SiO_2$. The refractory metal layer may also be deposited on a layer previously formed on the substrate 42, e.g., titanium, titanium nitride and the like.

ALD proceeds by chemisorption. The initial surface of the substrate 42 presents an active ligand to the process region. A batch of a first processing gas, in this case $Aa_x$, results in a layer of A being deposited on the substrate 42 having a surface of ligand x exposed to the processing chamber 37. Thereafter, a purge gas enters the processing chamber 37 to purge the gas $Aa_x$. After purging gas $Aa_x$ from the processing chamber 37, a second batch of processing gas, $Bb_y$, is introduced into the processing chamber 37. The a ligand present on the substrate surface reacts with the b ligand and B atom on the, releasing molecules ab and Ba, that move away from the substrate 42 and are subsequently pumped from the processing chamber 37. In this manner, a surface comprising a monolayer of A atoms remains upon the substrate 42 and exposed to the processing chamber 37, shown in FIG. 4. The process proceeds cycle after cycle, until the desired thickness is achieved, e.g. in a range of about 10 Å to about 100 Å.

Figure 5:
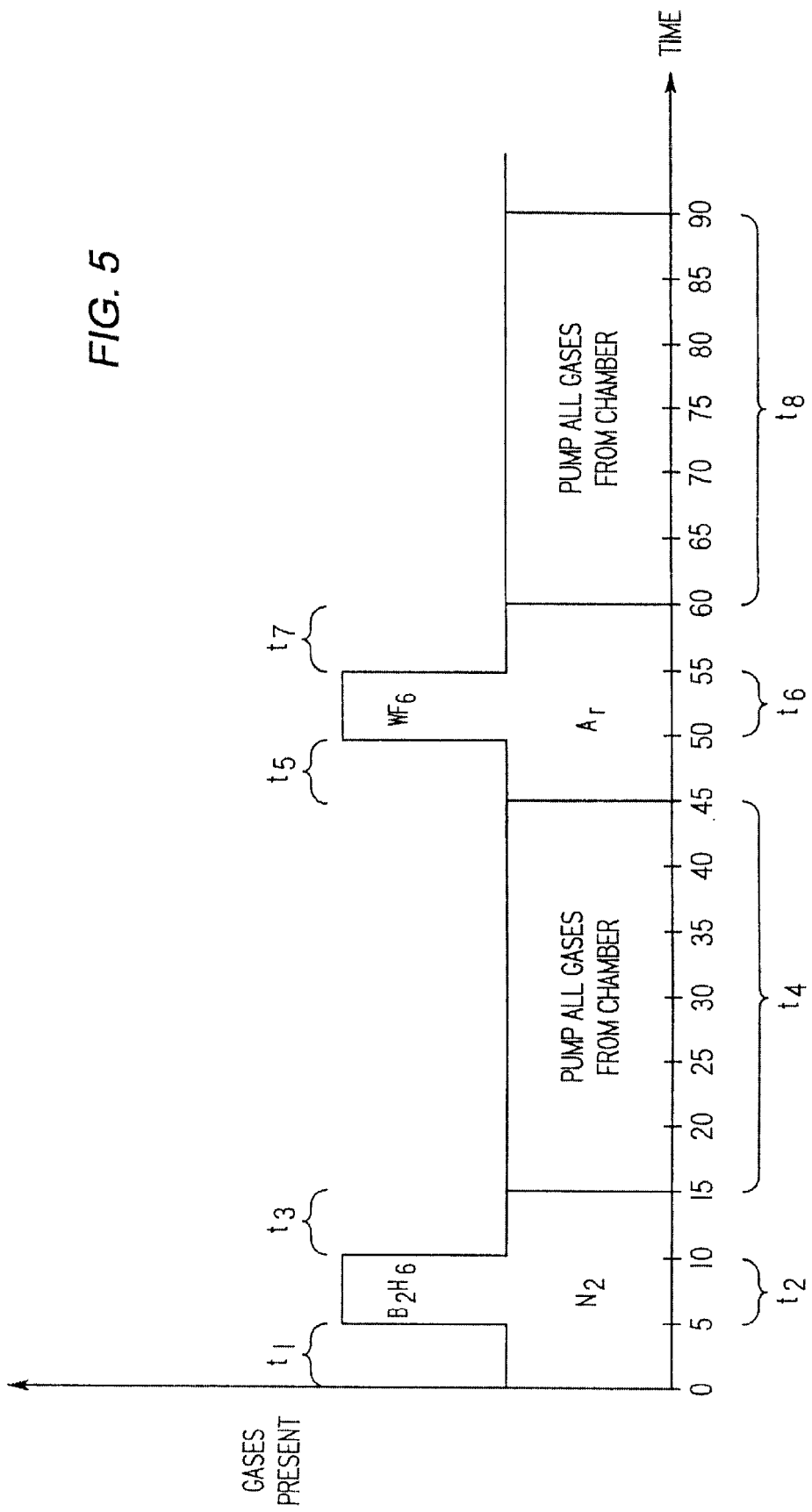
FIG. 5 is a graphical representation showing the concentration of gases, introduced into the processing chamber shown above in FIG. 2, and the time in which the gases are present in the processing chamber, in accordance with the present invention.

Referring to both FIGS. 2 and 5, although any type of processing gas may be employed, in the present example, the processing gas $Ay_x$ is $WF_6$ and the processing gas $Bb_y$ is $B_2H_6$. Two purge gases were employed: Ar and $N_2$. Each of the processing gases was flowed into the processing chamber 37 with a carrier gas, which in this example were one of the purge gases: $WF_6$ is introduced with Ar and $B_2H_6$ is introduced with $N_2$. It should be understood, however, that the purge gas may differ from the carrier gas, discussed more fully below. One cycle of the ALD technique in accordance with the present invention includes flowing the purge gas, $N_2$, into the processing chamber 37 during time $t_1$, which is approximately five seconds before $B_2H_6$ is flowed into the processing chamber 37. During time $t_2$, the processing gas $B_2H_6$ is flowed into the processing chamber 37 for approximately five seconds, along with a carrier gas, which in this example is $N_2$. After five seconds have lapsed, the flow of $B_2H_6$ terminates and the flow of $N_2$ continues during time $t_3$ for an additional five seconds, purging the processing chamber of $B_2H_6$. During time $t_4$, the processing chamber 37 is pumped so as to remove all gases. The pumping process lasts approximately thirty seconds. After pumping of the process chamber 37, the carrier gas Ar is introduced for approximately five seconds during time $t_5$, after which time the process gas $WF_6$ is introduced into the processing chamber 37 for about five seconds, along with the carrier gas Ar during time $t_6$. The flow of the processing gas $WF_6$ into the processing chamber 37 is terminated approximately five seconds after it commenced. After the flow of $WF_6$ into the processing chamber 37 terminates, the flow of Ar continues for five additional seconds, during time $t_7$. Thereafter, the processing chamber 37 is pumped so as to remove all gases therein, during time $t_8$. As before, the pumping process lasts approximately thirty seconds, thereby concluding one cycle of the ALD technique in accordance with the present invention.

The benefits of employing ALD are many fold, including flux-independence of layer formation that provides uniformity of deposition independent of the size of a substrate. For example, the measured difference of the layer uniformity and thickness measured between a 200 mm substrate and a 300 mm substrate deposited in the same chamber is negligible. This is due to the self-limiting characteristics of chemisorption. Further, the chemisorption characteristics contribute to a near-perfect step coverage over complex topography.

Figure 4:
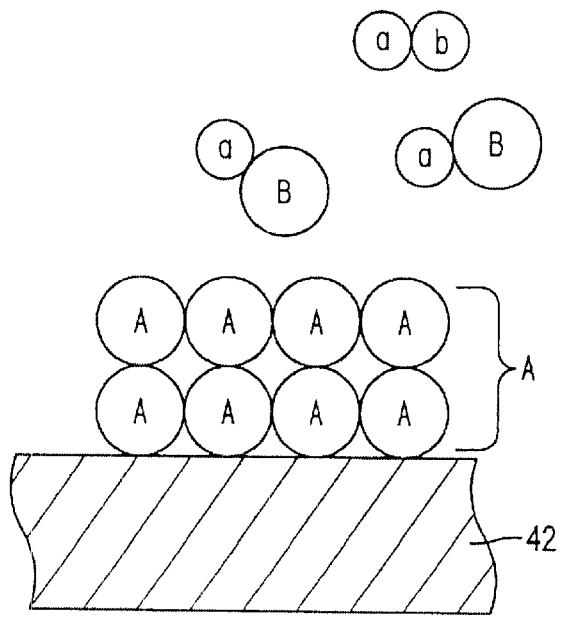
FIG. 4 is a schematic view showing deposition of second molecule onto a substrate during ALD to form a refractory metal layer.
Figure 6:
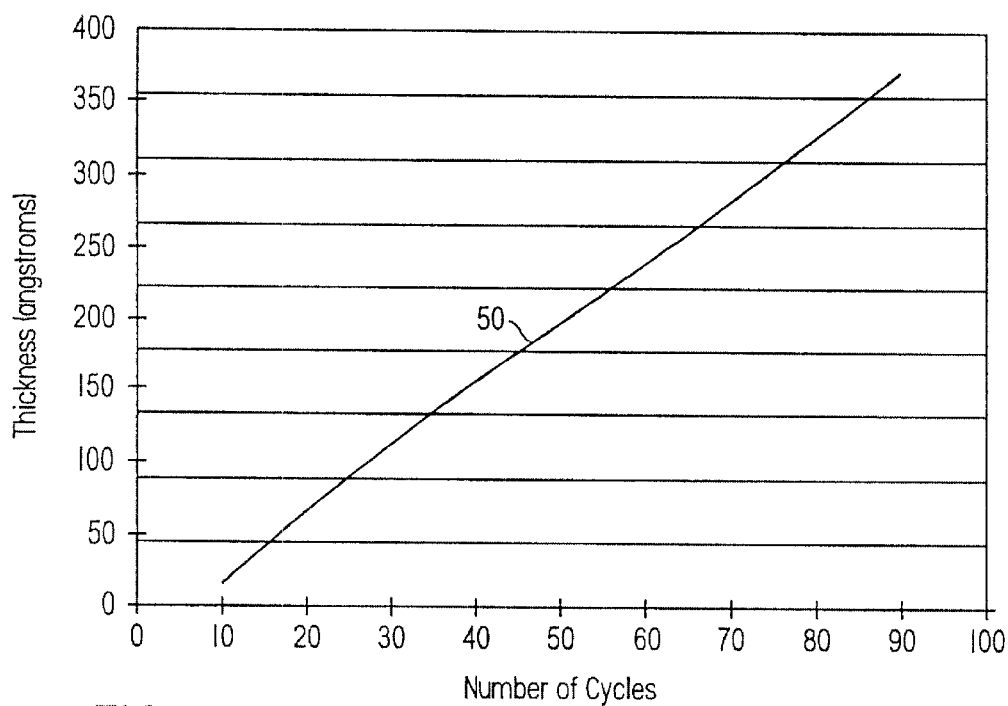
FIG. 6 is a graphical representation showing the relationship between the number of ALD cycles and the thickness of a layer formed on a substrate employing ALD, in accordance with the present invention.
Figure 7:
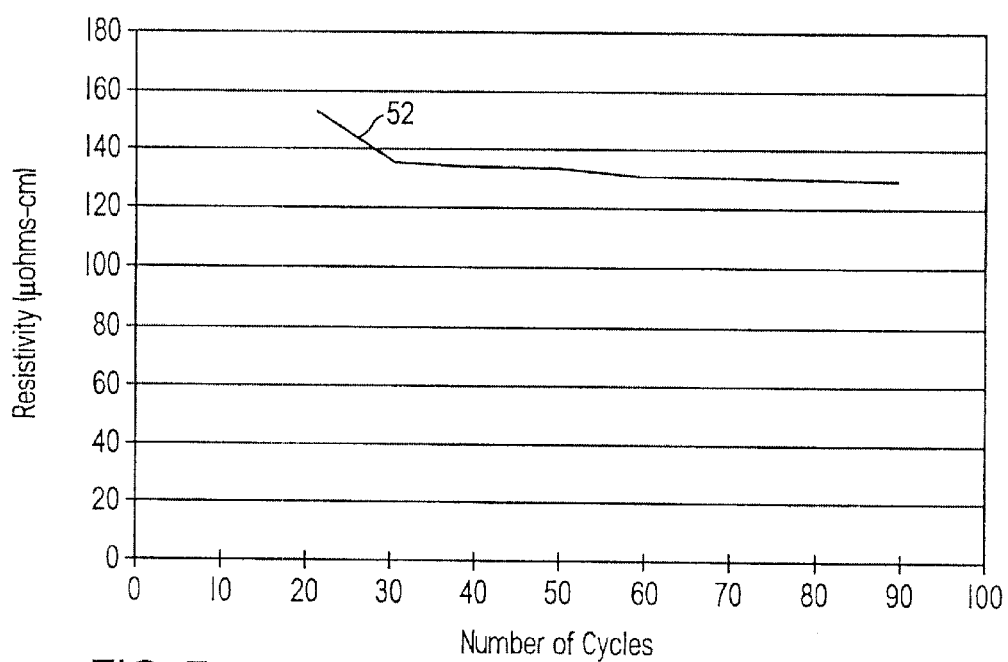
FIG. 7 is a graphical representation showing the relationship between the number of ALD cycles and the resistivity of a layer formed on a substrate employing ALD, in accordance with the present invention.

In addition, the thickness of the layer B, shown in FIG. 4, may be easily controlled while minimizing the resistance of the same by employing ALD. With reference to FIG. 6 it is seen the slope of line 50 that the thickness of the tungsten layer B is proportional to the number of cycles employed to form the same. The resistivity of the tungsten layer, however, is relatively independent of the thickness of the layer, as shown by the slope of line 52 in FIG. 7. Thus, employing ALD, the thickness of a refractory metal layer may be easily controlled as a function of the cycling of the process gases introduced into the processing chamber with a negligible effect on the resistivity.

Figure 8:
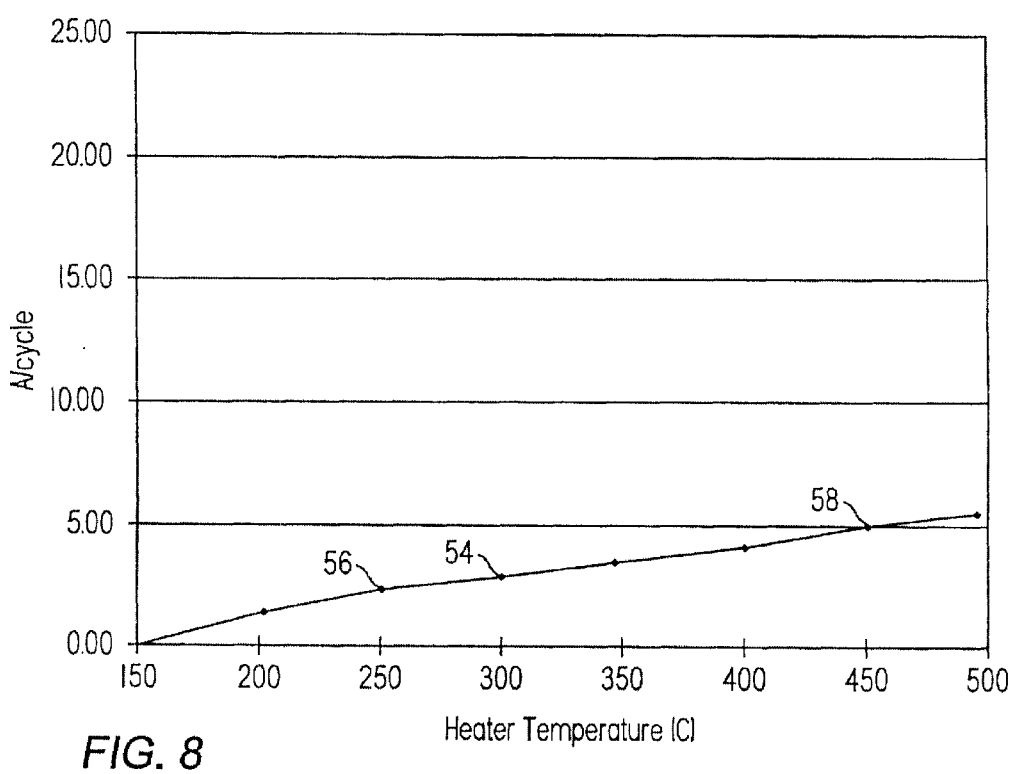
FIG. 8 is a graphical representation showing the relationship between the deposition rate of a layer formed on a substrate employing ALD and the temperature of the substrate.
Figure 9:
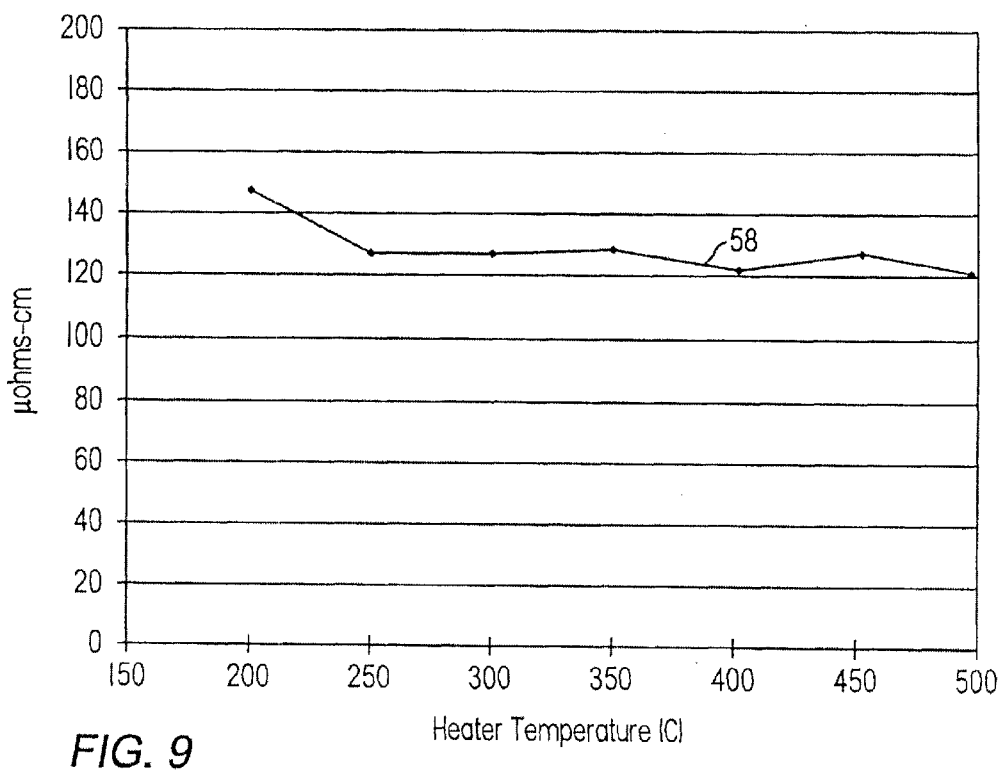
FIG. 9 is a graphical representation showing the relationship between the resistivity of a layer formed on a substrate employing ALD and the temperature of the substrate, in accordance with the present invention.

Referring to FIG. 8, control of the deposition rate was found to be dependent upon the temperature of the substrate 42. As shown by the slope of line 54, increasing the temperature of the substrate 42 increased the deposition rate of the tungsten layer B. For example, at 56, the deposition rate is shown to be approximately 2 Å/cycle at 250° C. However at point 56 the deposition rate is approximately 5 Å/cycle at a temperate of 450° C. The resistivity of the tungsten layer, however, is virtually independent of the layer thickness, as shown by the slope of curve 58, shown in FIG. 9. As a result, the deposition rate of the tungsten layer may be controlled as a function of temperature without comprising the resistivity of the same. However, it is preferred to perform many processing steps at temperatures well below 450° C.

Figure 10:
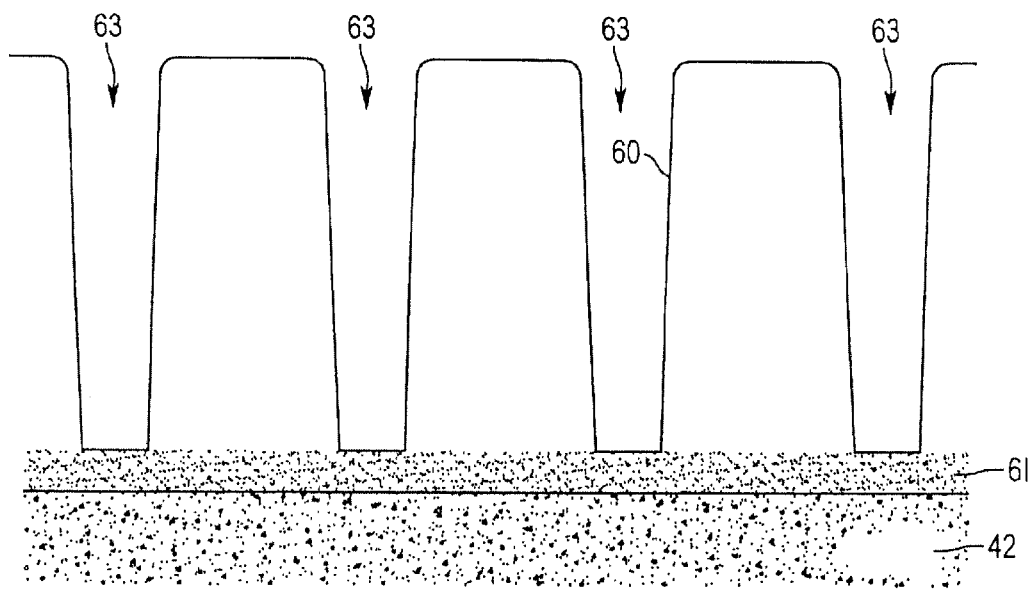
FIG. 10 is a cross-sectional view of a patterned substrate having a nucleation layer formed thereon employing ALD, in accordance with the present invention.
Figure 11:
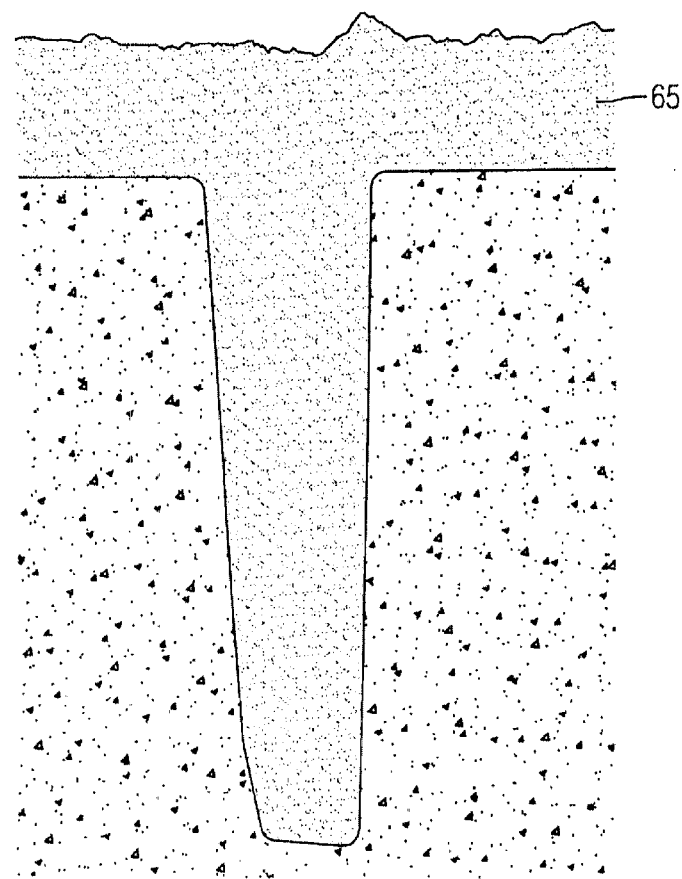
FIG. 11 is a partial cross-sectional view of the substrate, shown above in FIG. 10, with a refractory metal layer formed atop of the nucleation layer employing CVD, in accordance with the present invention.

To that end, a bifurcated deposition process may be practiced in which nucleation of the refractory metal layer occurs in a different chamber than the formation of the remaining portion of the refractory metal layer. Specifically, in the present example, nucleation of a tungsten layer occurs in chamber 12 employing the. ALD techniques discussed above, with the substrate 42 being heated in the range of 200° C. to 400° C., and the processing chamber 37 being pressurized in the range of 1 to 10 Torr. A nucleation layer 60 of approximately 12 to 20 nm is formed on a patterned substrate 42, shown in FIG. 10. As shown, the substrate 42 includes a barrier layer 61 and a patterned layer having a plurality of vias 63. The nucleation layer is formed adjacent to the patterned layer covering the vias 63. As shown in this embodiment, forming the nucleation layer 60 employing ALD techniques provides 100% step coverage. To decrease the time required to form a complete layer of a refractory metal, such as tungsten or titanium, a bulk deposition of tungsten onto the nucleation layer 60 occurs using CVD techniques, while the substrate 42 is disposed in processing chamber 14, shown in FIG. 1. The bulk deposition may be performed using recipes well known in the art. When tungsten (W) is employed, tungsten hexafluoride ($WF_6$) can be reduced using a reducing gas such as silane ($SiH_4$). In this manner, a tungsten layer 65 providing a complete plug fill is achieved on the patterned layer with vias having aspect ratios of approximately 6:1, shown in FIG. 11.

Figure 12:
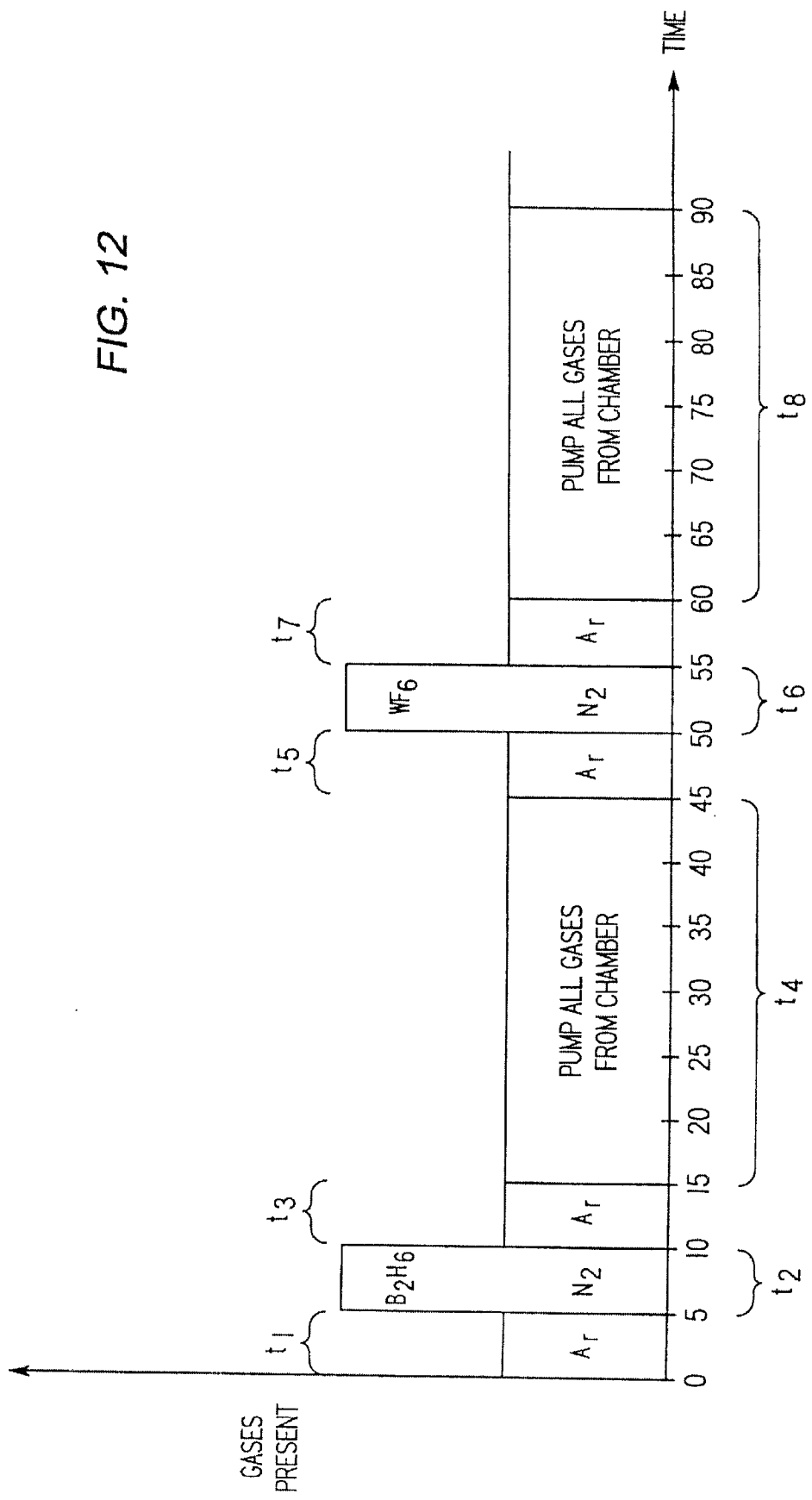
FIG. 12 is a graphical representation showing the concentration of gases shown above in FIG. 5 in accordance with a first alternate embodiment of the present invention.
Figure 13:
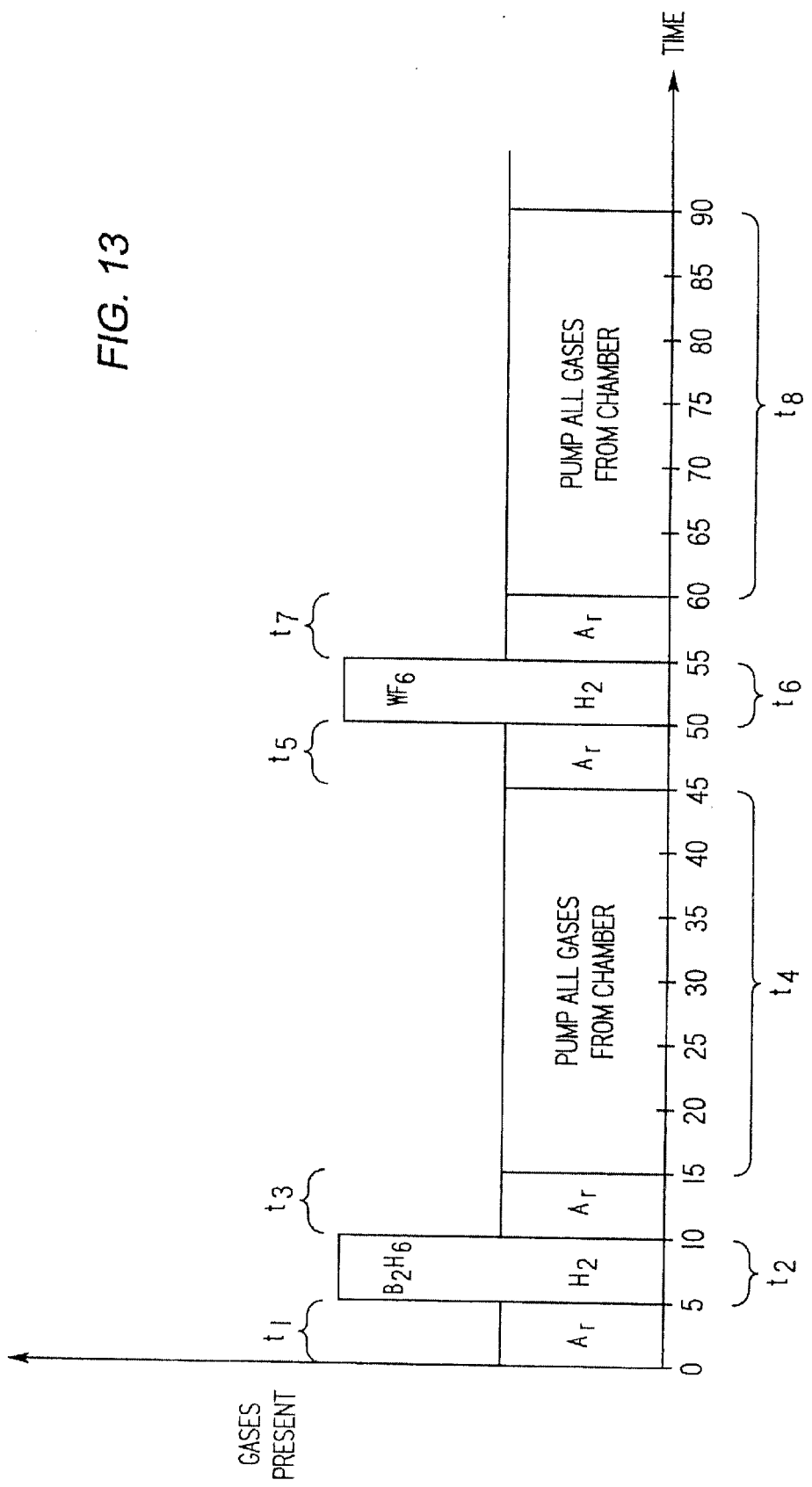
FIG. 13 is a graphical representation showing the concentration of gases shown above in FIG. 5 in accordance with a second alternate embodiment of the present invention.

As mentioned above, in an alternate embodiment of the present invention, the carrier gas may differ from the purge gas, as shown in FIG. 12. The purge gas, which is introduced at time intervals $t_1$, $t_3$, $t_5$ and $t_7$ comprises of Ar. The carrier gas, which is introduced at time intervals $t_2$ and $t_6$, comprises of $N_2$. Thus, at time interval $t_2$ the gases introduced into the processing chamber include a mixture of $B_2H_6$ and $N_2$, and a time interval $t_6$, the gas mixture includes $WF_6$ and $N_2$. The pump process during time intervals $t_4$ and $t_8$ is identical to the pump process discussed above with respect to FIG. 5. In yet another embodiment, shown in FIG. 13, the carrier gas during time intervals $t_2$ and $t_6$ comprises $H_2$, with the purge gas introduced at time intervals $t_1$, $t_3$, $t_5$ and $t_7$ comprising of Ar. The pump processes at time intervals $t_4$ and $t_8$ are as discussed above. As a result, at time interval $t_2$ the gas mixture introduced into the processing chamber 37 consists of $B_2H_6$ and $H_2$, and $WF_6$ and $H_2$, at time interval $t_6$.

Figure 14:
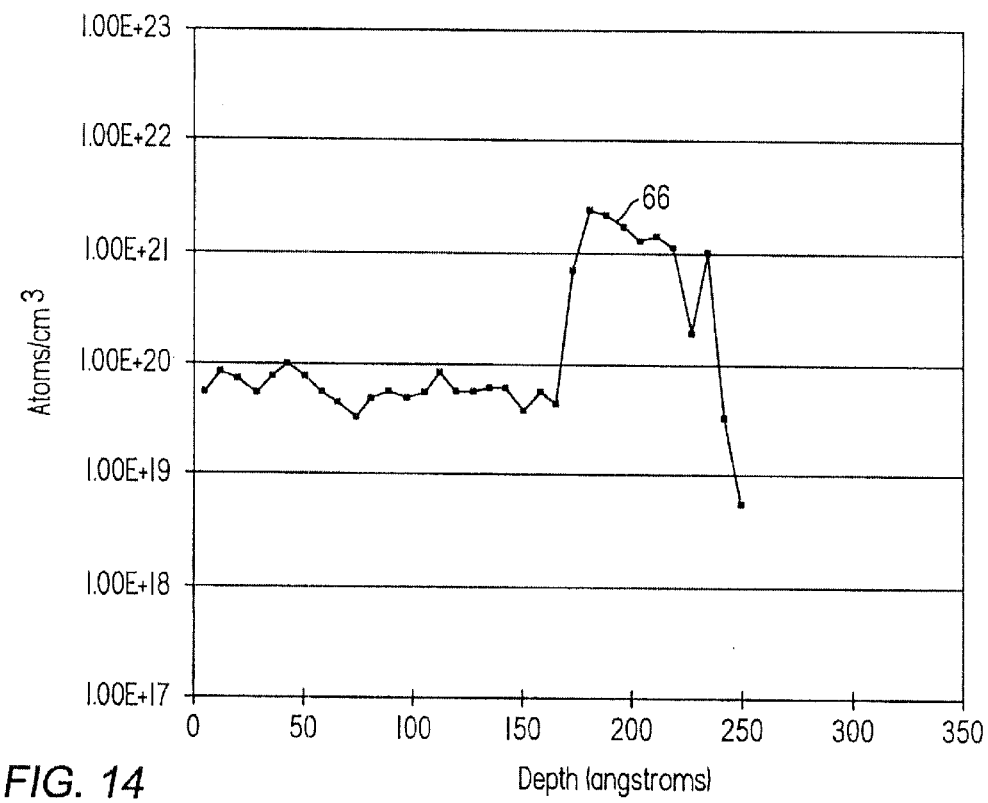
FIG. 14 is a graphical representation showing the fluorine content versus depth of a refractory metal layer formed on a substrate employing ALD either Ar or $N_2$ being a carrier gas.
Figure 15:
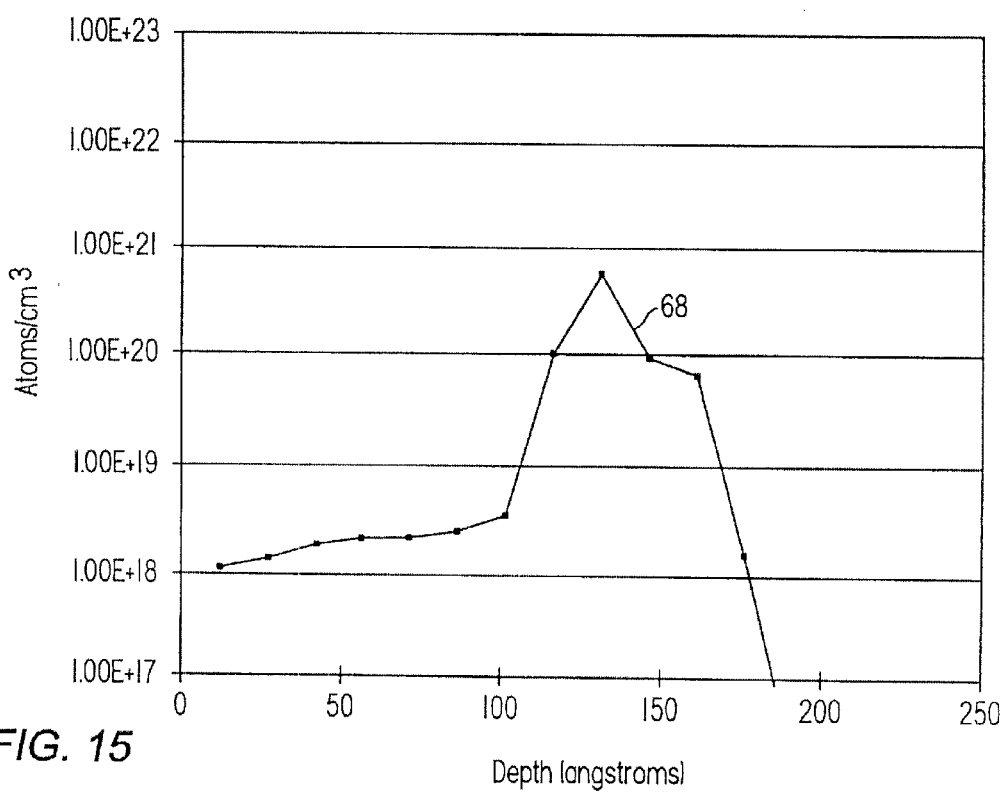
FIG. 15 is a graphical representation showing the fluorine contend versus depth of a refractory metal layer formed on a substrate employing ALD with $H_2$ being a carrier gas.

An advantage realized by employing the $H_2$ carrier gas is that the stability of the tungsten layer B may be improved. Specifically, by comparing curve 66 in FIG. 14 with the curve 68 in FIG. 15, it is seen that the concentration of fluorine in the nucleation layer 60 is much less when $H_2$ is employed as the carrier gas, as compared with use of $N_2$ as a carrier gas. Specifically, the apex and nadir of curve 66 show that the fluorine concentration reaches levels in excess of $1 \times 10^{21}$ atoms per cubic centimeter and only as low as just below $1 \times 10^{19}$ atoms per cubic centimeter. Curve 68, however, shows that the fluorine concentration is well below $1 \times 10^{21}$ atoms per cubic centimeter at the apex and well below $1 \times 10_{17}$ atoms per cubic centimeter at the nadir. Thus, employing $H_2$ as the carrier gas provides a much more stable film, i.e., the probability of fluorine diffusing into the substrate, or adjacent layer is reduced. This also reduces the resistance of the refractory metal layer by avoiding the formation of a metal fluoride that may result from the increased fluorine concentration. Thus, the stability of the nucleation layer, as well as the resitivity of the same, may be controlled as a function of the carrier gas employed. This is also true when a refractory metal layer is deposited entirely employing ALD techniques, i.e., without using other deposition techniques, such as CVD.

Referring again to FIG. 2, the process for depositing the tungsten layer may be controlled using a computer program product that is executed by the controller 22. To that end, the controller 22 includes a central processing unit (CPU) 70, a volatile memory, such as a random access memory (RAM) 72 and permanent storage media, such as a floppy disk drive for use with a floppy diskette, or hard disk drive 74. The computer program code can be written in any conventional computer readable programming language; for example, 68000 assembly language, C, C++, Pascal, Fortran and the like. Suitable program code is entered into a single file, or multiple files, using a conventional text editor and stored or embodied in a computer-readable medium, such as the hard disk drive 74. If the entered code text is in a high level language, the code is compiled and the resultant compiler code is then linked with an object code of precompiled Windows® library routines. To execute the linked and, compiled object code the system user invokes the object code, causing the CPU 70 to load the code in RAM 72. The CPU 70 then reads and executes the code to perform the tasks identified in the program.

Although the invention has been described in terms of specific embodiments, one skilled in the art will recognize that various changes to the reaction conditions, i.e., temperature, pressure, film thickness and the like can be substituted and are meant to be included herein. In addition, other refractory metals may be deposited, in addition to tungsten, and other deposition techniques may be employed in lieu of CVD. For example, physical vapor deposition (PVD) techniques, or a combination of both CVD and PVD techniques may be employed. Therefore, the scope of the invention should not be based upon the foregoing description. Rather, the scope of the invention should be determined based upon the claims recited herein, including the full scope of equivalents thereof.

What is claimed is:

1. A method for forming a layer of material on a substrate disposed in a processing chamber, said method comprising:
    forming a first sub-portion of said layer by placing said substrate in a first processing chamber and serially exposing said substrate to first and second reactive gases to nucleate said substrate with said material, creating a nucleation layer; and
    forming a second sub-portion of said layer by disposing said substrate in a second processing chamber and employing chemical vapor deposition to subject said nucleation layer to a bulk deposition of said material.

2. The method as recited in claim 1 wherein forming a first sub-portion further includes purging said first processing chamber of said first reactive gas by introducing a purge gas therein, before exposing said substrate to said second reactive gas.

3. The method as recited in claim 1 wherein forming a first sub-portion further includes purging said first processing chamber of said first reactive gas by pumping said first processing chamber clear of all gases disposed therein before introducing said second reactive gas.

4. The method as recited in claim 1 wherein forming a first sub-portion further includes purging said first processing chamber of said first reactive gas by introducing a purge gas and subsequently pumping said first processing chamber clear of all gases disposed therein before exposing said substrate to said second reactive gas.

5. The method as recited in claim 1 wherein forming said second sub-portion further includes reducing, within said second processing chamber, a refractory metal containing gas with silane.

6. The method as recited in claim 1 wherein forming a first sub-portion includes alternately exposing the substrate to a boron-containing compound and a refractory metal containing compound.

7. The method of claim 6 wherein alternately exposing the substrate to a boron-containing compound and a refractory metal containing compound further includes subjecting said substrate to a purge gas following the exposure of the substrate to each of the boron-containing and refractory metal containing compounds.

8. The method of claim 6 wherein the boron-containing compound is diborane ($B_2H_6$).

9. The method of claim 8 wherein the refractory metal containing compound is tungsten hexafluoride ($WF_6$).

10. The method of claim 7 wherein the purge gas is selected from a group of nitrogen ($N_2$), argon (Ar), hydrogen ($H_2$), and combinations thereof.

11. A method for forming a layer on a substrate, said method comprising:
    serially exposing said substrate to first and second reactive gases while said substrate is disposed in a first processing chamber to form a first sub-portion of said layer by chemisorption to create a nucleation layer;
    removing from said first processing chamber said first reactive gas before exposing said substrate to said second reactive gas;
    forming a second sub-portion of said layer, adjacent to said nucleation layer, by chemical vapor deposition while said substrate is disposed in a second processing chamber by concurrently exposing said nucleation layer to said second reactive gas and a reducing agent.

12. The method of claim 11 wherein said second reactive gas includes a refactory metal and said reducing agent includes silane.

13. The method of claim 12 wherein said refractory metal is selected from the group consisting of titanium (Ti) and tungsten (W).

14. The method of claim 11 wherein removing from said first processing chamber further includes introducing a purge gas into the first processing chamber and pumping said first processing chamber clear of all gases present therein.

15. The method as recited in claim 11 wherein said nucleation layer has a thickness in a range of about 10 to about 100 Å.

16. A method for forming a layer of material on a substrate disposed in a processing chamber, the method comprising:
forming a first sub-portion of the layer by placing the substrate in a first processing region and serially exposing the substrate to first and second reactive gases to nucleate the substrate with the material; and
forming a second sub-portion of the layer by disposing the substrate in a second processing region and subjecting the first sub-portion to a bulk deposition of the material.

17. The method as recited in claim 16 wherein the first processing region is a first processing chamber and the second processing region is a second processing chamber.

18. The method as recited in claim 17 wherein forming the second sub-portion further includes reducing, within the second processing chamber, a refractory metal containing gas with silane.

19. The method as recited in claim 17 wherein forming a first sub-portion further includes alternately exposing the substrate to a boron-containing compound and a refractory metal containing compound.

20. The method as recited in claim 19 wherein the boron-containing compound is diborane ($B_2H_6$).

21. The method of claim 20 wherein the refractory metal containing compound is tungsten hexafluoride ($WF_6$).

22. The method as recited in claim 19 wherein the purge gas is selected from a group consisting essentially of nitrogen ($N_2$), argon (Ar), hydrogen ($H_2$), and combinations thereof.

23. The method as recited in claim 19 wherein the refractory metal in the refractory metal containing compound is selected from a group consisting essentially of titanium (Ti) and tungsten (W).

24. The method as recited in claim 17 wherein the first portion has a thickness in a range of about 10 to about 100 Å.

25. The method as recited in claim 17 wherein forming a first sub-portion further includes purging the first processing chamber of the first reactive gas by introducing a purge gas therein.

26. The method as recited in claim 17 wherein forming a first sub-portion further includes purging the first processing chamber of the first reactive gas by pumping the first processing chamber.

27. The method as recited in claim 17 wherein forming a first sub-portion further includes purging the first processing chamber of the first reactive gas by introducing, into the first processing chamber, a purge gas, and pumping the first processing chamber.

28. The method as recited in claim 17 wherein forming a second sub-portion further includes subjecting the first sub-portion to bulk deposition techniques from a set of deposition techniques consisting essentially of Chemical Vapor Deposition and Physical Vapor Deposition.

29. The method as recited in claim 17 wherein forming a second sub-portion further includes subjecting the first sub-portion to a combination of chemical vapor deposition and physical vapor deposition techniques.

30. A method for forming one or more layers on a substrate, comprising:
forming a first portion of the one or more layers by placing the substrate in a first processing chamber and alternately exposing the substrate to at least first and second precursor gases; and
forming a second portion of the layer by disposing the substrate in a second processing chamber and depositing the second portion by one or more of chemical vapor deposition, cyclical vapor deposition, and physical vapor deposition.

31. The method of claim 30 wherein the first portion and the second portion comprise at least one common material.

32. The method of claim 31 wherein the first portion and the second portion each comprise at least tungsten.

33. The method of claim 32 wherein the second portion is formed by chemical vapor deposition.

34. The method as recited in claim 30 wherein forming the first portion further includes purging the first processing chamber of the first reactive gas by introducing a purge gas therein, before exposing the substrate to the second reactive gas.

35. The method as recited in claim 30 wherein forming the first portion further includes purging the first processing chamber of the first reactive gas by pumping the first processing chamber before introducing the second reactive gas.

36. The method as recited in claim 30 wherein forming the first portion further includes introducing a purge gas after the first reactive gas and pumping the first processing chamber before exposing the substrate to the second reactive gas.

37. The method as recited in claim 30 wherein forming the second portion further includes reducing, within the second processing chamber, a refractory metal containing gas with silane.

38. The method as recited in claim 30 wherein forming the first portion includes alternately exposing the substrate to a boron-containing compound and a refractory metal containing compound.

39. The method of claim 38 wherein alternately exposing the substrate to a boron-containing compound and a refractory metal containing compound further includes subjecting the substrate to a purge gas following exposure to each of the boron-containing compound and the refractory metal containing compound.

40. The method of claim 38 wherein the boron-containing compound is diborane ($B_2H_6$).

41. The method of claim 40 wherein the refractory metal containing compound is tungsten hexafluoride ($WF_6$).

42. The method of claim 39 wherein the purge gas is selected from nitrogen ($N_2$), argon (Ar), hydrogen ($H_2$), and combinations thereof.

43. A method for forming at least a portion of a layer on a substrate comprising:
alternately exposing the substrate to first and second gases to form a first portion of the layer;
forming at least a second portion of the layer on the first portion by a bulk deposition technique.

44. The method of claim 43 wherein the second portion is formed by exposing the substrate to a refractory metal containing gas and a reducing gas.

45. The method of claim 44 wherein the refractory metal in the refractry metal containing gas is selected from titanium (Ti) and tungsten (W).

46. The method of claim 43 further comprising introducing a purge gas while serially exposing the substrate to the first and second gases.

47. The method as recited in claim 43 wherein the first portion of the layer has a thickness in a range of about 10 to about 100 Å.

48. The method of claim 43 wherein the second portion is formed by one or more of chemical vapor deposition, cyclical vapor deposition or physical vapor deposition.

49. A method for forming a layer on a substrate disposed in a processing chamber, comprising:
forming a first portion of the layer by placing the substrate in a first processing region and alternately exposing the substrate to at least first and second reactive gases; and forming a second portion of the layer by chemical vapor deposition.

50. The method as recited in claim 49 wherein forming the second portion comprises reducing a refractory metal containing gas with a reducing gas.

51. The method as recited in claim 49 wherein forming the first portion further includes adsorbing alternating layers of a boron-containing compound and a refractory metal containing compound onto the substrate.

52. The method as recited in claim 51 wherein the boron-containing compound is diborane ($B_2H_6$).

53. The method of claim 52 wherein the refractory metal containing compound is tungsten hexafluoride ($WF_6$).

54. The method as recited in claim 51 further comprising delivering a purge gas selected from the group of nitrogen ($N_2$), argon (Ar), hydrogen ($H_2$), and combinations thereof while alternately exposing the substrate to the first and second reactive gases.

55. The method as recited in claim 51 wherein the refractory metal in the refractory metal containing compound is selected from titanium (Ti) and tungsten (W).

56. The method as recited in claim 50 wherein the first portion has a thickness in a range of about 10 to about 100 Å.

57. The method as recited in claim 50 wherein forming the first portion further includes purging the first processing region of the first reactive gas by introducing a purge gas therein.

58. The method as recited in claim 50 wherein forming the first portion further includes purging the first processing region of the first reactive gas by pumping the first processing region.

59. The method as recited in claim 50 wherein forming the first portion further includes purging the first processing region of the first reactive gas by introducing, into the first processing region, a purge gas, and pumping the first processing region.

60. The method as recited in claim 50 wherein forming the second portion further includes subjecting the substrate to a combination of chemical vapor deposition and physical vapor deposition techniques.

* * * * *

UNITED STATES PATENT AND TRADEMARK OFFICE
CERTIFICATE OF CORRECTION

PATENT NO. : 6,551,929 B1
DATED : April 22, 2003
INVENTOR(S) : Kori et al.

It is certified that error appears in the above-identified patent and that said Letters Patent is hereby corrected as shown below:

<u>Column 7,</u>
Line 13, please change "$1 \times 10_{17}$" to -- $1 \times 10^{17}$ --.

Signed and Sealed this

Twelfth Day of August, 2003

JAMES E. ROGAN
*Director of the United States Patent and Trademark Office*